(12) United States Patent
Lin et al.

(10) Patent No.: US 6,480,414 B1
(45) Date of Patent: Nov. 12, 2002

(54) MULTI-LEVEL MEMORY CELL

(75) Inventors: Hong Chin Lin, Taipei (TW); Shyh-Chyi Wong, Taichung (TW); Tai-Yuan Chen, Pingtung (TW)

(73) Assignee: Winbond Electronics Corp., Hsinchu (TW)

( * ) Notice: Subject to any disclaimer, the term of this patent is extended or adjusted under 35 U.S.C. 154(b) by 179 days.

(21) Appl. No.: 09/586,835

(22) Filed: Jun. 5, 2000

(30) Foreign Application Priority Data

Jan. 11, 2000 (TW) ........................................ 89100330 A

(51) Int. Cl.$^7$ .............................................. G11C 16/04
(52) U.S. Cl. ............................ 365/185.03; 365/185.14; 365/185.29
(58) Field of Search ....................... 365/185.03, 185.14, 365/185.29

(56) References Cited

U.S. PATENT DOCUMENTS 6,281,545 B1 * 8/2001 Liang et al. ................. 257/314
6,344,993 B1 * 2/2002 Harari et al. ................ 257/315

FOREIGN PATENT DOCUMENTS

JP  2-246375  * 10/1990

OTHER PUBLICATIONS

Ma, Y., et al., "A Dual–bit Split–Gate EEPROM (DSG) Cell in Contactless Array for Single–Vcc High Density Flash Memories," *IEDM Tech. Dig.*, 1994, pp. 57–60.

* cited by examiner

Primary Examiner—A. Zarabian
(74) Attorney, Agent, or Firm—Ladas & Parry

(57) ABSTRACT

A multi-level memory cell has a substrate, a first floating gate, a second floating gate and a control gate. A first doped region, a second doped region and a channel region located between the first doped region and the second doped region are provided in the substrate. The first floating gate is located over the channel region near the first doped region. The second floating gate is located over the channel region near the second doped region and isolated from the first floating gate. A control gate is located over the first and the second floating gates. When writing operations are proceeding, the bias voltages of the control gates are the same, and a constant bias voltage is provided on the first doped region or the second doped region depending on which binary states 11, 10, 01 or 00 are to write. Furthermore, the same bias voltage is used on the control gate during writing operation. Thus, the memory per unit chip area is enhanced and the peripheral circuits are simplified.

23 Claims, 2 Drawing Sheets

MULTI-LEVEL MEMORY CELL

BACKGROUND OF THE INVENTION

1. Field of the Invention

The present invention relates to a semiconductor memory device. More particularly, the present invention relates to a multi-level memory cell that can store several bits of digital data. Thus, the bit storage capacity per unit chip area is enhanced and complicated peripheral circuits are not needed.

2. Description of the Prior Art

With CMOS technology deepening to below sub-micron, the density of flash memory has been enhanced and thus the cost per bit can be cut down. Several kinds of memories with multi-level structures have been developed, such as DRAM, SDRAM, and flash memory. Multi-level flash memory is presently the most popular.

Conventionally, one flash memory cell could store only one bit of digital data (binary 0 or 1). In the reading operation, two levels of threshold voltage are provided according to the charge amount stored in the floating gate of flash memory cell. When charges are injected into the floating gate, representing "binary 0", the threshold voltage is higher. If no charge is present in the floating gate, representing "binary 1", the threshold voltage is lower. Therefore, a two-level flash memory cell is used to store one bit. If one memory cell has more than two levels of threshold voltage, such as four levels, eight levels or more, that is, multi-level memory cell, it is possible to store two bits, three bits or more, respectively. Thus, the storage capacity per unit chip area is enhanced.

Several kinds of multi-level flash memory cell structures, such as common ground, DINOR, AND, NOR, NAND, have been researched. In the writing operation, CHE (Channel Hot Electron) injection mode or FN (Fower-Nordheim) tunnel mode is used to write in the above-mentioned multi-level flash memory cell structures. In order to control the charge amount injecting into the floating gate, several levels of voltage are provided on the control gate and source/drain junctions. In the earsing operation, FN tunnel mode is generally used.

Multi-storage flash memory is another memory structure capable of storing several bits of digital data. In the multi-storage flash memory charge is stored in different floating gates. The writing, reading and erasing conditions are the same as in a single bit flash memory, e.g., each flash memory cell storing one bit of digital data, but their structures are different. Y. Ma et al. disclose a dual-bit split-gate (DSG) flash memory cell in "A dual-bit split-gate (DSG) EEPROM cell in contactless array for single-$V_{cc}$ high density flash memories", IEDM Tech. Dig., 1994, pp. 57–60. FIG. 1 shows one DSG flash memory cell comprising two doped regions 12 and 14 serving as source/drain in the substrate 11, two floating gates 15 and 16, a selected gate 17, a control gate 18 and a transfer gate 19. The DSG flash memory cell comprises two memory units with one pair common source/drain 12 and 14 to store two bits.

For conventional multi-level flash memory, different voltages levels are needed to perform a writing operation; thus, peripheral circuits are more complicated.

Furthermore, reliability is worse then the single bit flash memory. On the other hand, the performance and reliability of the multi-storage flash memory are similar to the single bit memory, but the memory cell occupies much more area and peripheral circuits are also complicated.

SUMMARY OF THE INVENTION

The present invention provides a multi-level memory cell combining the advantages of multi-level and multi-storage memories. The multi-level memory cell of the present invention does not require complicated peripheral circuits and its reliability is the same as that of conventional memories. Its size falls between that of the conventional multi-level memory and multi-storage memory.

In first embodiment of the present invention, a multi-level memory cell comprises a substrate, a first floating gate, a second floating gate, and a control gate. A first doped region, a second doped region, and a channel region located between the first doped region and the second doped region are provided in the substrate, wherein the first and second doped regions have different dosages and implant energies. The first floating gate is located over the channel region and near the first doped region. The second floating gate is located over the channel region and near the second doped region and isolated from the first floating gate. The control gate is located over the first floating gate and the second floating gate.

In a second embodiment of the present invention, a multi-level memory cell comprises a substrate, a first floating gate, a second floating gate, a control gate, and an erasing gate. A first doped region, a second doped region, and a channel region located between the first doped region and the second doped region are provided in the substrate, wherein the first and second doped regions have different dosages. The first floating gate is located over the channel region and near the first doped region. The second floating gate is located over the channel region and near the second doped region and isolated from the first floating gate. The control gate is located over the first floating gate and the second floating gate. The erasing gate is located beside the first and the second floating gates.

In the present invention, the first doped region and the second doped region serve as source and drain. Because the concentrations and junction depths of source and drain are different, different charges can be stored in the first floating gate and the second floating gate using the same bias voltage. Thus, a multi-level memory is obtained without complicated peripheral circuits.

BRIEF DESCRIPTION OF THE DRAWINGS

The present invention will become more fully understood from the detailed description given herein below and the accompanying drawings, given by way of illustration only and thus not intended to be limitative of the present invention.

DETAILED DESCRIPTION OF THE INVENTION

FIRST EMBODIMENT

Figure 1:
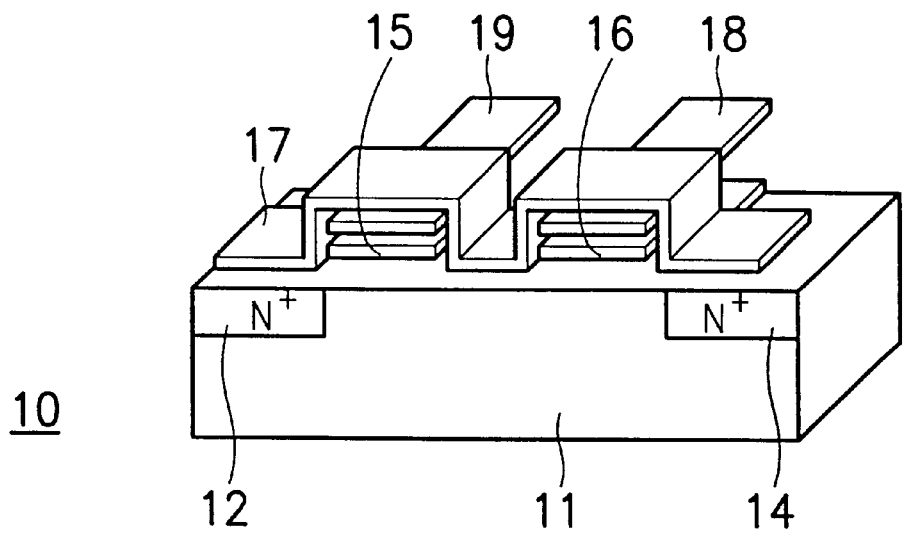
FIG. 1 illustrates a DSG flash memory according to the prior art.
Figure 2:
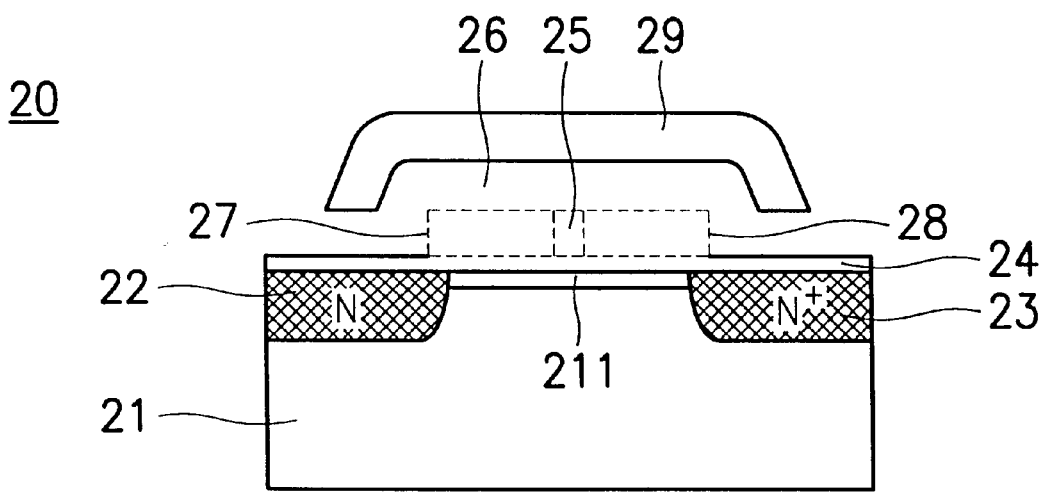
FIG. 2 is a cross-sectional view of the multi-level memory cell according to the first embodiment of the present invention.

FIG. 2 shows a perspective view of a multi-level, such as four-level, memory cell of the present invention. The multi-level memory cell 20 which comprises two doped regions 22 and 23 formed in a substrate 21 with different dosages and implant energies serving as source/drain, a channel region 211, a gate oxide layer 24, an insulating layer 25 isolating two floating gates 27 and 28 from each other, an ONO layer 26, and a control gate 29. It is intentionally to make the doped regions 22 and 23 have different dosages and implant energies, such that the depths of doped regions 22 and 23 are similar. It is understood that these characteristic can be altered according to the dosages and implant energies used.

The dosage of the doped region 22 is higher than that of the doped region 23, so that the charges stored in the floating gates 27 and 28 are different. Source and drain are not defined herein, because the doped regions 22 and 23 could be regarded as source/drain or drain/source when the writing operation is performed.

In this embodiment, the thickness of the gate oxide layer 24 is about 80 Å; the length of the floating gates 27 and 28 is about 0.075 μm; the space between the floating gates 27 and 28 is about 0.03 μm; the dosage and implant energy of the doped region 22 doped with arsenic (As) is about $5\times10^{13}$ cm$^{-2}$ and 40 keV; the dosage and implant energy of the doped region 23 doped with As is about $1\times10^{16}$ cm$^{-2}$ and 30 keV; the floating gates 27 and 28 and the control gate 29 are made of such as polysilicon.

This embodiment uses CHE injection with the assistance of drain avalanche hot electrons (DAHE) in the writing mode because of it advantages over FN tunneling. For example, CHE injection has a faster writing speed, a favorable threshold voltage and less interference. For convenience of explanation, the substrate 21 is grounded. However, it is understood that a negative voltage or a floating node could also be provided to enhance the writing and erasing performance.

Since data "0", "1", "2", and "3" are stored in one cell in the four-level memory cell in this embodiment, four charge amount corresponding to the data are stored in the floating gates 27 and 28. The writing, reading and erasing operations of the four-level memory cell according to the present invention are illustrated as follow:

1. Write
   a. data "0" state: No charge exits in the floating gates 27 and 28. This represents the code "11" in the binary scale.
   b. data "1" state: A bias voltage, such as 6V, is provided on the control gate 29. A bias voltage, such as 4V, is provided on the doped region 22, and the doped region 23 is grounded. After charging 10 μsec, the charge in the floating gate 27 is about −1.437 fCoulomb but there is no charge in the floating gate 28. This represents the code "10" in the binary scale.
   c. data "2" state: A bias voltage, such as 6V, is provided on the control gate 29. A bias voltage, such as 4V, is provided on the doped region 23, and the doped region 22 is grounded. After charging 10 μsec, the charge in the floating gate 28 is about −2.235 fCoulomb but no charge in the floating gate 27. This represents the code "01" in the binary scale.
   d. data "3" state: Charge 10 μsec in condition c. Then charge 10 μsec in condition b. As a result, the charges in the floating gate 27 and 28 are −1.180 and −2.235 fCoulomb respectively. This represents the code "00" in the binary scale.

Note that the charges in the floating gate 27 and 28 under condition b and c are different because the doping concentrations in the doped regions 22 and 23 are different. The benefit of the present invention is that the same bias voltage can be used in condition b and c. Therefore, no additional circuits with different bias voltages are needed.

It is understood that the data "0", "1", "2", and "3" state can be used to represent binary states 11, 01, 10, and 00 by any set of associations.

2. Read

A proper voltage is provided on the control gate 29 when a reading operation is performed. The substrate 21 is still grounded. The doped regions 22 and 23 serve as drain and source, respectively. The bias voltage in the drain (the doped region 22) need not too high. The only requirement is that the bias voltage be higher than the voltage detectable by an amplifier or a current comparator.

3. Erase

The control gate 29 is grounded or biased at a zero or negative bias voltage when a erasing operation is performed. The doped regions 22 and 23 are floating. A positive voltage, for example about 10V, is provided on the substrate 21. As a result, the negative charges in the floating gate 27 and 28 will flow into the substrate 21 by channel FN tunneling.

Second Embodiment

Figure 3A:
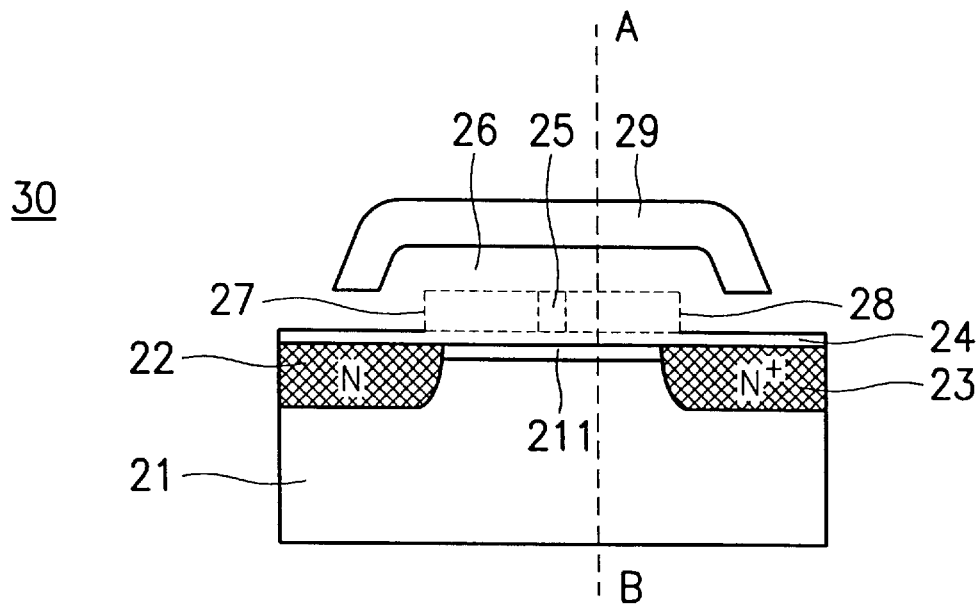
FIGS. 3A and 3B are cross-sectional views of the multi-level memory cell according to the second embodiment of the present invention.
Figure 3B:
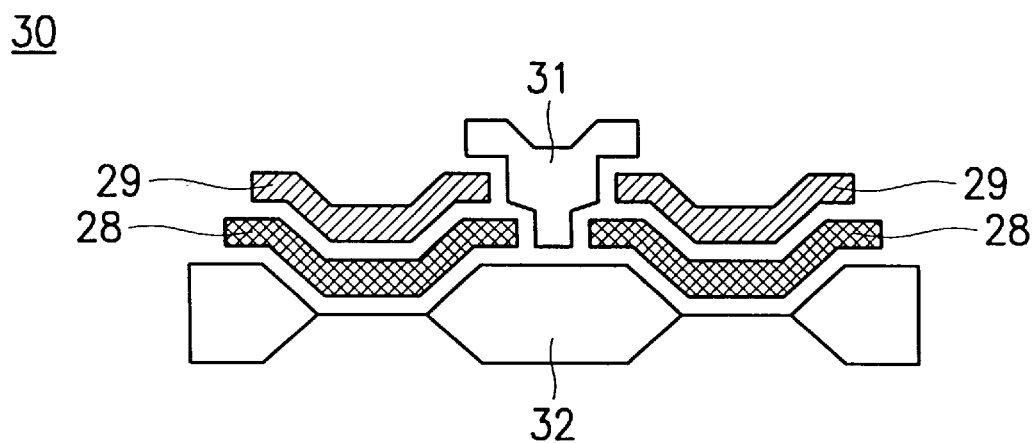

Referring to FIGS. 3A and 3B, cross-sectional views of the multi-level memory cell 30 according to the second embodiment of the present invention are shown. FIG. 3B is the cross-sectional view along the cutting line AB of FIG. 3A. The same numerals are used to denote the elements that are the same as in FIG. 2. The difference between the multi-level memory cell 20 and 30 is that the latter has an additional erasing gate 31 located over a field oxide region 32 and beside the floating gate 28, wherein the floating gate 28 is isolated from the erasing gate 31 each other. An erasing operation is performed when a positive voltage is provided on the substrate 21, a zero or negative bias voltage is provided on the erasing gate 31, and the doped regions 22 and 23 are floating. The negative charges in the floating gate 27 and 28 flow out through the channel region 211 by channel FN tunneling when the erasing operation is performed. The reading and writing operations are the same as those in the multi-level memory cell 20 in FIG. 2, so another illustration is not needed.

As described above, the present invention provides a multi-level memory cell with two floating gates. Because the doping concentration of source and drain are different, using one bias voltage to write different data is possible. Therefore, the present invention combines the advantage of the general multi-level and multi-storage memory cells. Complicated peripheral circuits are not needed and the memory per unit chip area is enhanced.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A multi-level memory cell, comprising:
   a substrate having a first doped region, a second doped region, and a channel region located between the first doped region and the second doped region;

a first floating gate located over the channel region near the first doped region;

a second floating gate located over the channel region near the second doped region and isolated from the first floating gate;

an insulating block having a first side and a second side, wherein the first side is connected to the first floating gate, and the second side is connected to the second floating gate; and a control gate located over the first floating gate and the second floating gate, wherein the first doped region and the second doped region have different dosages and implant energies.

2. The memory cell as claimed in claim 1, wherein the first floating gate and the $\mu$second floating gate comprise polysilicon.

3. The memory cell as claimed in claim 1, wherein the control gate comprises polysilicon.

4. The memory cell as claimed in claim 1, wherein the insulating block comprising oxide.

5. The memory cell as claimed in claim 1, further comprising a gate oxide layer located between the substrate and the first and second floating gates.

6. The memory cell as claimed in claim 1, further comprising an ONO layer located between the control gate and the first and the second floating gates.

7. The memory cell as claimed in claim 1, wherein, under a high voltage applied to the control gate, a bias voltage is applied to the second doped region to write a data "1", a bias voltage is applied to the first doped region to write a data "2", and a bias voltage is applied to the first doped region and then the second doped region to write a data "3".

8. The memory cell as claimed in claim 1, wherein an erasing operation is performed when a positive voltage is provided on the substrate, a negative bias voltage is provided on the control gate, and the first and second doped regions are floating.

9. The memory cell as claimed in claim 1, wherein an erasing operation is performed when a positive voltage is provided on the substrate, a zero bias voltage is provided on the control gate, and the first and second doped regions are floating.

10. The memory cell as claimed in claim 1, wherein a reading operation is performed by providing a very small positive voltage on the higher doped region between the first doped region and the second doped region and detecting an output current.

11. A multi-level memory cell, comprising:

a substrate having a first doped region, a second doped region, and a channel region located between the first doped region and the second doped region;

a first floating gate located over the channel region near the first doped region;

a second floating gate located over the channel region near the second doped region and isolated from the first floating gate;

an insulating block having a first side and a second side, wherein the first side is connected to the first floating gate, and the second side is connected to the second floating gate;

a control gate located over the first floating gate and the second floating gate; and an erasing gate located beside the first and the second floating gates;

wherein the first doped region and the second doped region have different dosages and implant energies.

12. The memory cell as claimed in claim 11, wherein the first floating gate and the second floating gate comprise polysilicon.

13. The memory cell as claimed in claim 11, wherein the control gate comprises polysilicon.

14. The memory cell as claimed in claim 11, wherein the insulating block comprising oxide.

15. The memory cell as claimed in claim 11, further comprising a gate oxide layer located between the substrate and the first and the second floating gates.

16. The memory cell as claimed in claim 11, further comprising an ONO layer located between the control gate and the first and the second floating gates.

17. The memory cell as claimed in claim 11, wherein an erasing operation is performed when a positive voltage is provided on the substrate, a negative bias voltage is provided on the erasing gate, and the first and second doped regions are floating.

18. The memory cell as claimed in claim 11, wherein an erasing operation is performed when a positive voltage is provided on the substrate, a zero bias voltage is provided on the erasing gate, and the first and second doped regions are floating.

19. The memory cell as claimed in claim 11, wherein a reading operation is performed by providing a very small positive voltage on the higher doped region between the first doped region and the second doped region and detecting an output current.

20. A multi-level memory cell, comprising:

a substrate having a first doped region, a second doped region, and a channel region located between the first doped region and the second doped region;

a first floating gate located over the channel region near the first doped region;

a second floating gate located over the channel region near the second doped region and isolated from the first floating gate; and a control gate located over the first floating gate and the second floating gate, wherein the dosage of the first doped region is higher than that of the second doped region and the first and second doped regions have different implant energies, wherein when a high voltage applied to the control gate, a first bias voltage is applied to the second doped region to write a data "1", a second bias voltage is applied to the first doped region to write a data "2", and a third bias voltage is applied to the first doped region and then the second doped region to write a data "3".

21. The memory cell as claimed in claim 20, wherein an erasing operation is performed when a positive voltage is provided on the substrate, a negative bias voltage is provided on the control gate, and the first and second doped regions are floating.

22. The memory cell as claimed in claim 20, wherein an erasing operation is performed when a positive voltage is provided on the substrate, a zero bias voltage is provided on the control gate, and the first and second doped regions are floating.

23. The memory cell as claimed in claim 20, wherein a reading operation is performed by providing a very small positive voltage on the first doped region which has higher dosage and detecting an output current.

* * * * *